United States Patent [19]

Fandrich et al.

[11] Patent Number: 5,197,034
[45] Date of Patent: Mar. 23, 1993

[54] FLOATING GATE NON-VOLATILE MEMORY WITH DEEP POWER DOWN AND WRITE LOCK-OUT

[75] Inventors: Mickey Lee Fandrich, Placerville; Virgil N. Kynett, El Dorado Hills; Kurt B. Robinson, Newcastle, all of Calif.

[73] Assignee: Intel Corporation, Santa Clara, Calif.

[21] Appl. No.: 773,247

[22] Filed: Oct. 9, 1991

Related U.S. Application Data

[63] Continuation-in-part of Ser. No. 698,546, May 10, 1991.

[51] Int. Cl.⁵ .............................. G11C 11/00
[52] U.S. Cl. ...................... 365/227; 365/185; 365/228
[58] Field of Search .......... 365/185, 227, 168, 189.09, 365/189.11, 228; 307/465

[56] References Cited

U.S. PATENT DOCUMENTS

| | | | |
|---|---|---|---|
| 4,387,449 | 6/1983 | Masuda | 365/227 |
| 4,718,043 | 1/1988 | Akatsuka | 365/227 |
| 4,906,862 | 3/1990 | Itano et al. | 365/227 |
| 5,084,843 | 1/1992 | Mitsuishi et al. | 365/228 |
| 5,113,373 | 5/1992 | Lee | 365/227 |

*Primary Examiner*—Eugene R. LaRoche
*Assistant Examiner*—Andrew Tran
*Attorney, Agent, or Firm*—Blakely, Sokoloff, Taylor & Zafman

[57] ABSTRACT

A non-volatile memory is described. The memory includes a memory array that includes a main block and a boot block. The memory also includes a control input for receiving a control signal. The control signal can be in a first voltage state, a second voltage state, and a third voltage state. Circuitry means is coupled to receive the control signal at the control input for (1) allowing the boot block to be updated when the control signal is in the first state and for (2) generating a power off signal to switch the memory into a substantially powered off state when the control signal is in the third voltage state. A method of controlling a non-volatile memory is also described.

9 Claims, 3 Drawing Sheets

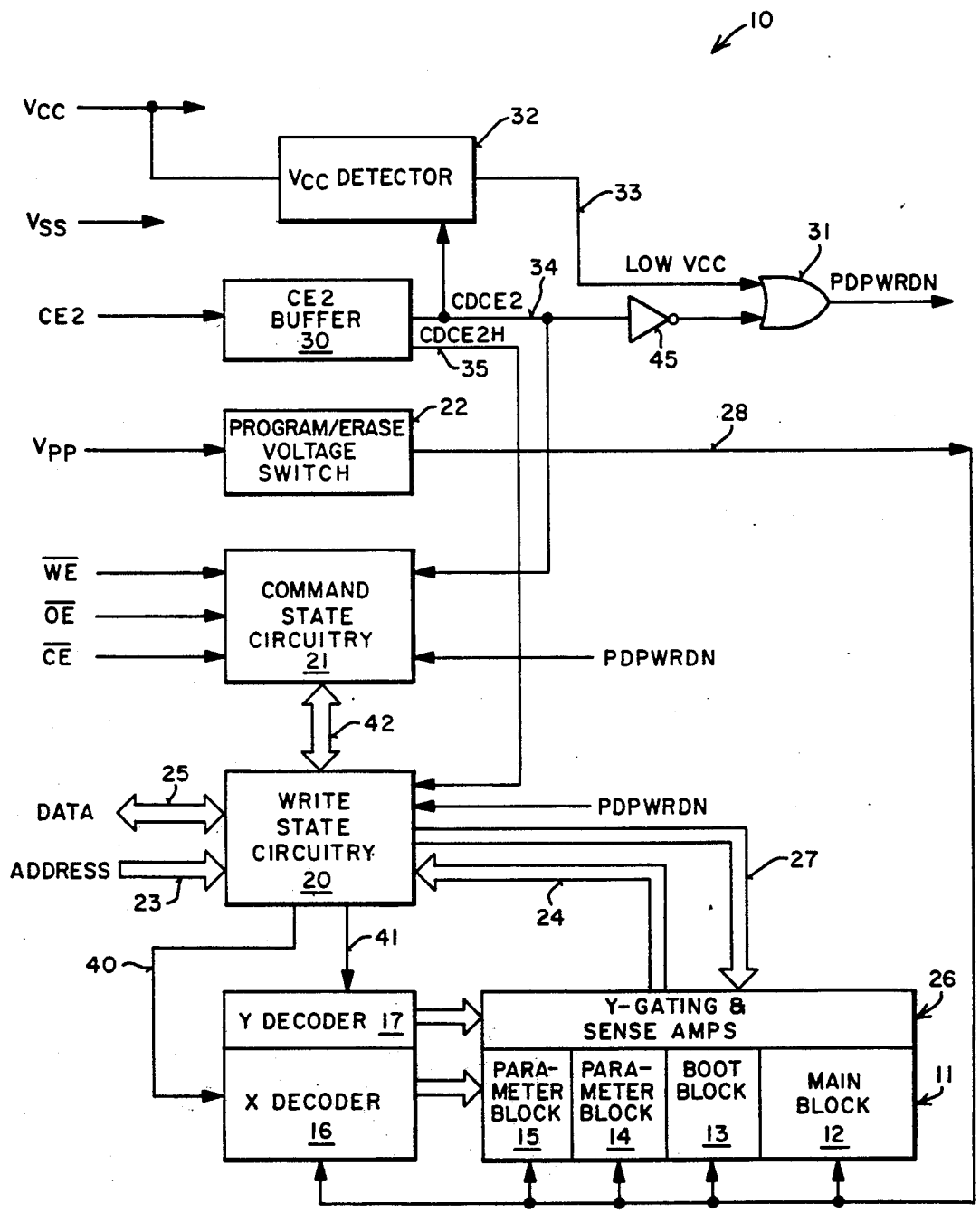

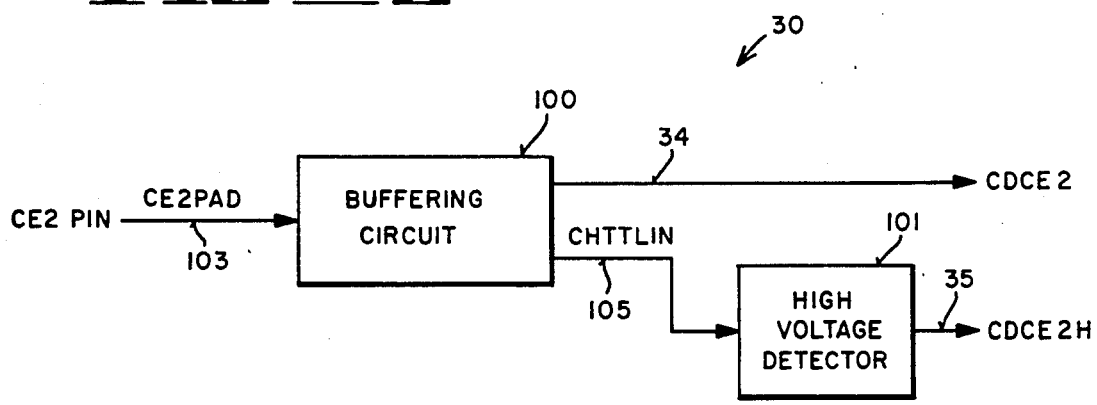
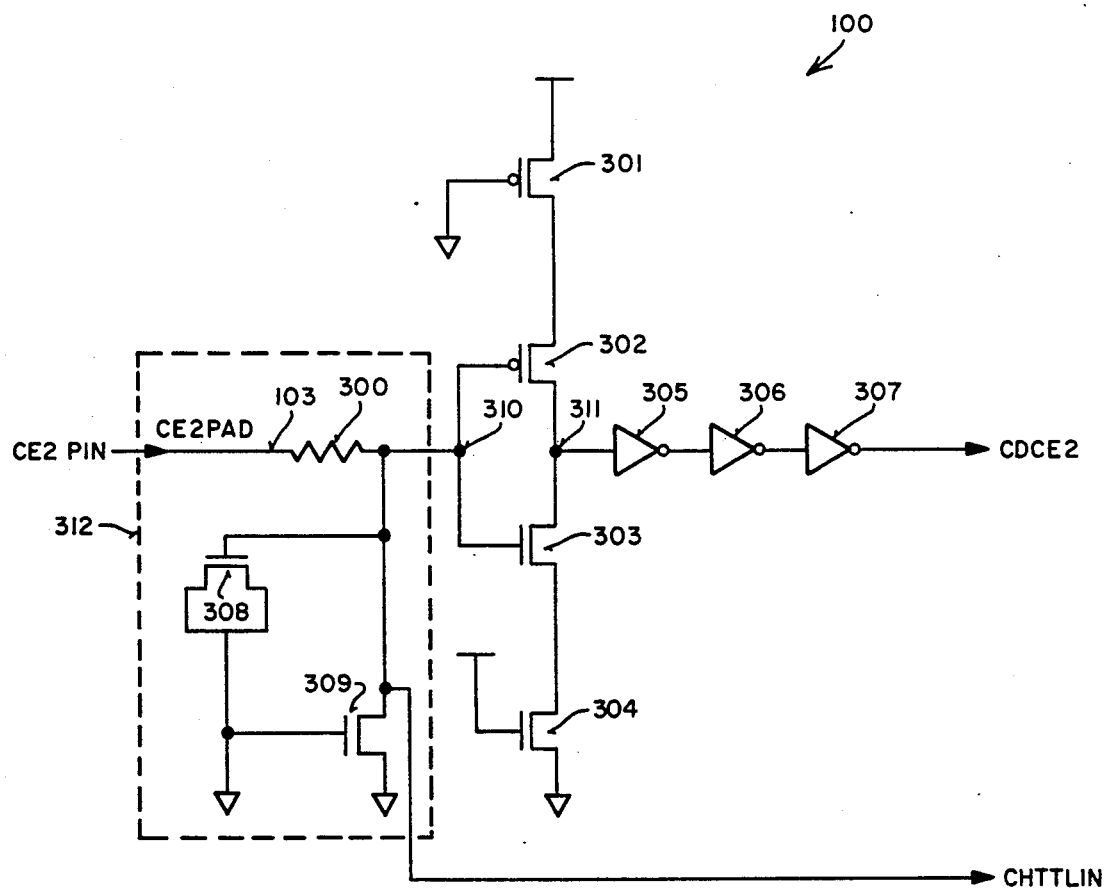

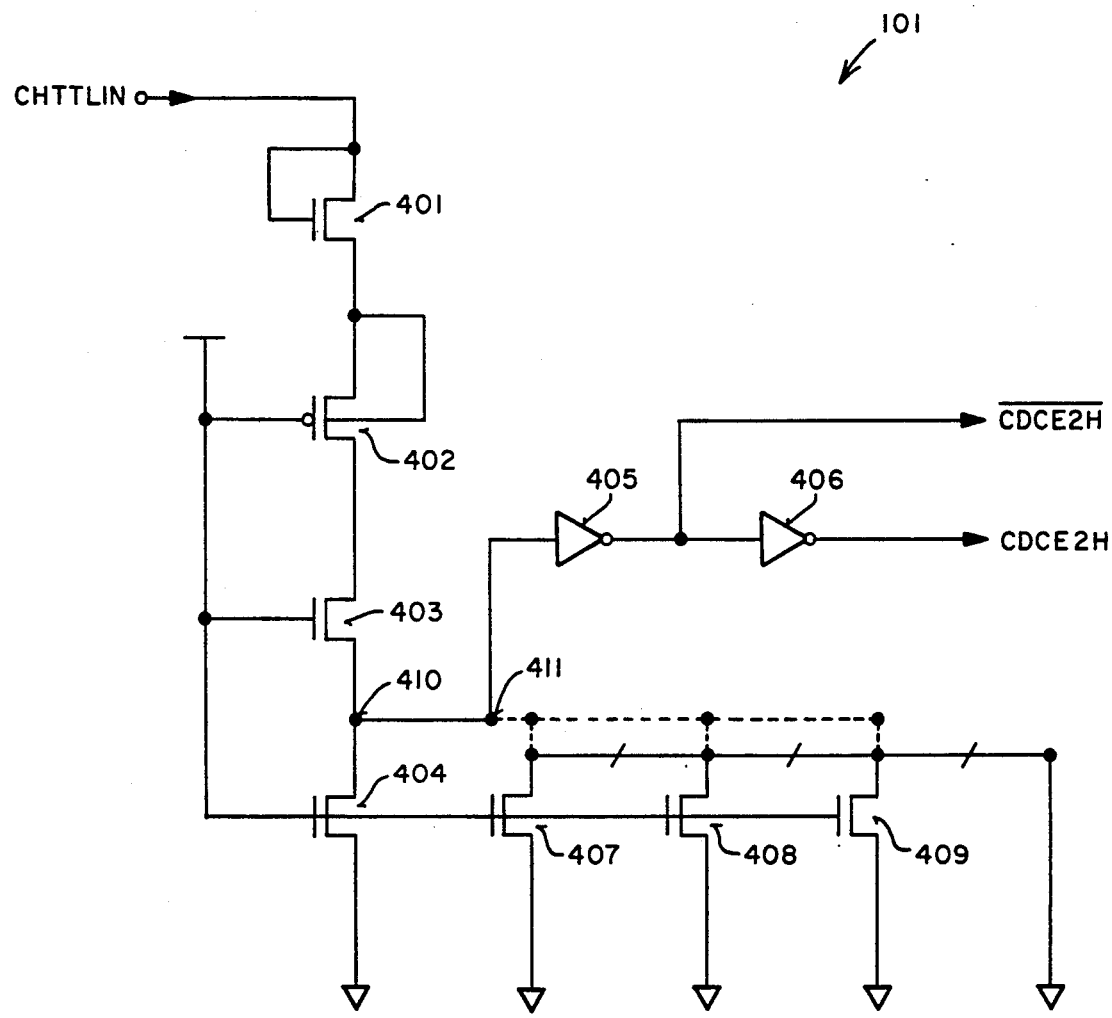

FLOATING GATE NON-VOLATILE MEMORY WITH DEEP POWER DOWN AND WRITE LOCK-OUT

RELATED APPLICATION

This is a continuation-in-part of application Ser. No. 07/698,546, filed May 10, 1991.

FIELD OF THE INVENTION

The present invention pertains to the field of non-volatile read-only memories. More particularly, the present invention relates to floating gate memory devices incorporating deep power down and memory write protection features.

BACKGROUND OF THE INVENTION

Metal-oxide-semiconductor ("MOS") electrically programmable read-only memories ("EPROMs") frequently use memory cells that have electrically isolated gates (i.e., floating gates). Information is stored in the memory cells in the form of charge on the floating gates.

One type of prior EPROM is the flash erasable and electrically programmable read-only memory ("flash EPROM"). The flash EPROM can be programmed by a user, and once programmed, the flash EPROM retains its data until erased. Once programmed, the contents of the flash EPROM can be erased by electrical erasure. The flash EPROM may then be reprogrammed with new codes or data.

The flash EPROM typically includes a plurality of normal operating modes. Those normal operating modes include read modes, write modes, and a standby mode. For a read mode, a logical low signal is applied to both the chip enable pin $\overline{CE}$ and the output enable pin $\overline{OE}$. This permits data stored in the flash EPROM to be read out as addressed. Addresses are provided at the address pins to access the data stored in the memory array.

A write mode allows device erasure and programming in the flash EPROM. Operation of the flash EPROM in the write mode also includes the read operation. The flash EPROM enters into the write mode by applying a 12 volt high voltage to the Vpp pin of the flash EPROM and a logical low voltage at the write enable pin $\overline{WE}$ while the chip enable pin $\overline{CE}$ is at logical low level. Operations of the flash EPROM, such as read, program or erase, are selected by writing specific commands into its command register at the write enable signal $\overline{WE}$. The commands typically include the erase command, the erase verify command, the program command, the program verify command, and the read command. When the 12 volt high voltage is removed from the Vpp pin of the flash EPROM, the content of the command register defaults to the read command, making the flash EPROM a read-only memory.

A standby mode is entered by applying a Vcc high voltage at the chip enable pin $\overline{CE}$ of the device. Power consumption of the flash EPROM is substantially reduced in the standby mode.

One disadvantage of this prior flash EPROM is that the flash EPROM still consumes a certain amount of power in the standby mode. One reason is that some circuits in the flash EPROM need to be or are powered during the standby mode. For example, the bias circuit for content addressable memory ("CAM") cells in the flash EPROM is maintained fully powered during the standby mode. The flash EPROM typically includes CAM cells in addition to the main memory array. The CAM cells can be programmed to configure the memory device operation (for example, latched inputs, CEBTTL active high, and OEBTTL active high). The CAM cells can also be used to activate (or deactivate) redundancy cells with respect to the main memory array. The redundancy cells are used in place of defective cells of the main memory array.

Another circuit in the flash EPROM that needs to be powered in the standby mode is the Vcc voltage detector. The Vcc voltage detector needs to be constantly fully powered in order to detect a low Vcc condition at any time.

In one prior flash EPROM, the memory array can store data and program code. A separate flash memory may, for example, be used to store boot code. The boot code can be program code for system initialization and reprogramming, for example. Boot code typically requires minimal updating.

One disadvantage of the above way of storing boot code is that at least two memories are required—one to store the boot code, and the other to store other program code and data—in order to avoid inadvertent erasure or programming of the boot code. Inadvertent erasure or programming of the boot code has the potential for rendering an entire computer system nonfunctional.

SUMMARY AND OBJECTS OF THE INVENTION

One object of the present invention is to provide a non-volatile memory device that can be substantially powered down without removing the power supply.

Another object of the present invention is to provide a write protection function for the non-volatile memory device that helps to prevent inadvertent programming or erasing part of the memory.

A non-volatile memory is described. The memory includes a memory array that includes a main block and a boot block. The memory also includes a control input for receiving a control signal. The control signal can be in a first voltage state, a second voltage state, and a third voltage state. Circuitry means is coupled to receive the control signal at the control input for (1) allowing the boot block to be updated when the control signal is in the first state and (2) for generating a power off signal to switch the memory into a substantially powered off state when the control signal is in the third voltage state.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a block diagram of the layout of a flash EPROM, including a CE2 buffer;

FIG. 2 is a block diagram of the CE2 buffer of FIG. 1, including a buffering circuit and a high voltage detector;

FIG. 3 is a circuit diagram of the buffering circuitry;

FIG. 4 is a circuit diagram of the high voltage detector.

DETAILED DESCRIPTION

FIG. 1 illustrates in block diagram form the circuitry of a flash EPROM 10, which implements a preferred embodiment of the present invention. Flash EPROM 10 includes a memory array 11, which includes memory cells that store data at addresses. In one embodiment, memory array 11 can store 1 megabits ("Mbits") (i.e.,1,048,576 bits) of information. In alternative embodiments, memory array 11 can store more or fewer than 1 Mbits of information. In one alternative embodiment, for example, memory array 11 stores 512 kilobits of information.

Memory array 11 includes a main block 12, a boot block 13, and two parameter blocks 14 and 15. Main block 12 is used to store data or program code or both. Boot block 13 stores program codes for system initialization and stores reprogramming algorithms, for example. Boot block 13 is the portion of memory array 11 typically requiring the least amount of updating. Parameter blocks 14 and 15 are provided to allow the user to store frequently updated system parameters and configuration information.

In one embodiment, main block 12 of memory array 11 is organized into bit line blocks by arranging bit lines into groups. In another embodiment, main block 12 of memory array 11 is organized into word line blocks by arranging word lines into groups.

In one embodiment, boot block 12 of flash EPROM 10 is 8K bytes in size. In a further embodiment, parameter blocks 14 and 15 of flash EPROM 10 are each 4K bytes in size.

In a preferred embodiment, the circuitry of flash EPROM 10 shown in FIG. 1 is on a single substrate. In a preferred embodiment, flash EPROM 10 employs CMOS circuitry.

Flash EPROM 10 includes X decoder 16 and Y decoder 17. X decoder 16 is the row decoder for memory array 11 and Y decoder 17 is the column decoder for memory array 11. X decoder 16 is coupled to word lines of memory array 11. X decoder 16 receives X addresses from address buses 23 and 40. X decoder 16 selects one word line in accordance with each of the X addresses provided via bus 23.

Y decoder 17 is coupled, via Y gating 26, to bit lines of memory array 11. Y decoder 17 receives its Y addresses from address buses 23 and 41. In one of read and program operations, Y decoder 23 selects one byte of bit line (i.e., 8 bit lines) for each of the Y addresses applied. Y gating 26 also includes sense amplifiers.

In the embodiments in which main block 12 of memory array 11 is organized into blocks—wherein each block includes a block common source line—a block decoder (not shown) is required to decode the blocked main block 12 for a block erase operation. A block address is applied to the block decoder of main block 12. The block decoder then couples a high erase voltage Vpp to the selected common source line of the selected block. In this way, only the source regions of the memory cells of the selected block are coupled to the high erase voltage Vpp during the block erasure operation. The source regions of the memory cells in the unselected blocks remain uncoupled to the high erase voltage Vpp, thereby achieving the blocked erasure in main block 12 of flash EPROM 10.

The block decoder for the blocked main block 12 is coupled to the common source lines for all the blocks within main block 12. The block decoder receives its X or Y address as its block address. The block decoder then selects one block by selecting the common source line associated with the selected block for any given block address.

For one embodiment, main block 12 is organized into word line blocks. The block decoder for main block 12 then receives the X addresses. The block decoder then selects one block by selecting the common source line associated with the selected block for any given X address.

For another embodiment, main block 12 is organized into bit line blocks and the block decoder receives Y addresses.

Given that each of the blocks in main block 12 has only one common source line coupled to its associated block decoder, only a subset of either the X addresses or the Y addresses is required to determine which block has been selected and conversely which blocks are not selected. Thus, the block decoder is an intermediate decoding stage of an X or Y decoder. In an alternative embodiment, the block decoder is a separate decoder.

Flash EPROM 10 also includes an on-chip write state circuitry 20 and an on-chip command state circuitry 21. Write state circuitry 20 is coupled to data bus 25 and address bus 23. Write state circuitry 20 sequences flash EPROM 10 through multistep sequences to program or erase memory contents as desired, with only an initiating command from an external microprocessor (not shown). The command is applied by the external microprocessor to command state circuitry 21 via data bus 25. Command state circuitry 21 decodes the command, and if the command is an erase, program, or status register reset command, command state circuitry 21 generates the appropriate control signals to write state circuitry 20.

Flash EPROM 10 also includes a program/erase voltage switch 22. Program/erase voltage switch 22 passes the program voltage Vpp onto X decoder 16 and a program voltage Vp onto Y decoder 17 via line 28. The program voltage Vp is the lowered program voltage Vpp. In one embodiment, the program voltage Vp is approximately +7 volts. Program/erase voltage switch 22 also passes the erase voltage Vpp to memory array 11 via line 28.

Vpp is the erase/program power supply voltage for flash EPROM 10. Vpp is coupled to program/erase voltage switch 22 of flash EPROM 10. Vcc is the device power supply for flash EPROM 10 and Vss is ground. In one embodiment, Vpp is approximately 12.0 volts and Vcc is approximately 5.0 volts.

In the absence of the high Vpp voltage on the Vpp input pin to flash EPROM 10, EPROM 10 acts as a read-only memory. The data stored at an address supplied via address bus 23 and decoded by X and Y decoder 16 and 17 is read from memory array 11 and made available through sense amplifier 26 via buses 24 and 25, and via state control circuitry 20 to the external microprocessor.

Flash EPROM 10 includes three control signals coupled to command state circuitry 21—namely, chip enable $\overline{CE}$, output enable $\overline{OE}$, and write enable $\overline{WE}$. Chip enable input $\overline{CE}$ is the power control and is used for device selection of flash EPROM 10. The output enable input $\overline{OE}$ is the output control for flash EPROM 10 and is used to gate data from the output pins from flash EPROM 10, dependent on device selection. Both of the control functions $\overline{CE}$ and $\overline{OE}$ must be logically active to obtain data at the outputs of flash EPROM 10. When the chip enable pin $\overline{CE}$ is high at Vcc voltage, flash EPROM 10 enters a standby mode. In the standby mode, power consumption by flash EPROM 10 is reduced.

The write enable signal $\overline{WE}$ allows writes to command state circuitry 21 while chip enable input $\overline{CE}$ is active low. Write enable signal $\overline{WE}$ is active low. Addresses and data are latched on the rising edge of the write enable $\overline{WE}$ signal. Standard microprocessor timings are used.

Device operations of flash EPROM 10, such as read, program, and erase, are selected by writing specific commands into command state circuitry 21 via data bus 25. The commands may include the erase set-up command, the erase confirm command, the program set-up command, the program command, and the read command. While Vpp is high for erasure and programming, memory array 11 can be accessed via the read command as well.

Erase is initiated by a two-cycle command sequence. The erase set-up command is first written into command state circuitry 21, followed by the erase confirm command. Array preconditioning, erase, and erase verification are all handled internally by write state circuitry 20.

Programming is also executed by a two-cycle command sequence. The program set-up command is first written into command state circuitry 21, followed by the program command specifying the address and data to be programmed. Write state circuitry 20 then takes over, controlling the program and verify algorithms internally.

The program and erase algorithms are regulated by write state circuitry 20 internally, including program pulse repetition where required and internal verification and margin of data. This is also referred to as internal write automation.

Write state circuitry 20 includes a status register (not shown). The external microprocessor can access the status register by issuing a Read Status Register command to command state circuitry 21. The status data stored in the status register is then read by the external microprocessor to determine when the erase or program operation is completed, and whether the operation is completed successfully. The status register may be read at any time by writing the Read Status Register command to command state circuitry 21.

Commands to program or erase memory array 11 are applied via data bus 25. Command state circuitry 21 decodes the data and if it represents an erase, program, or status register reset command, command state circuitry 21 begins generating the appropriate control signals. The control signals provided by command state circuitry 21 are applied to write state circuitry 20 via bus 42.

Write state circuitry 20 latches in the necessary address and data needed to complete erase and program operations from address bus 23 and data bus 25. The address and data latch operations of write state circuitry 20 are controlled by the control signals from the command state circuitry 21 via bus 42.

Write state circuitry 20 controls the device operations of flash EPROM 10. It controls the erase/program operation by controlling the application of the high program/erase voltage Vpp to memory array 11. Write state circuitry 20 interfaces with memory array 11 via lines 40 and 41, and buses 24 and 27. Write state circuitry 20 applies addresses to memory array 11 via lines 40 and 41. Write state circuitry 20 applies data to be programmed to memory array 11 via bus 27. Write state circuitry 20 receives data read from memory array 11 and sensed by sense amplifier 26 via bus 24.

Write state circuitry 20 includes a write lock-out protection mechanism (not shown) for boot block 13. As described above, boot block 13 stores secure code that will minimally initiate a system and control the program and erase operation on main block 12 and parameter blocks 14 and 15 of flash EPROM 10. Therefore, the write lock-out protection mechanism needed for boot block 13 helps to maintain data integrity. The write lock-out mechanism informs write state circuitry 20 when boot block 13 is allowed to be updated by a program and/or erase operation. When the write lock-out protection mechanism indicates that the program or erase operation of boot block 13 is prohibited, write state circuitry 20 is locked from accessing boot block 13 for a program and/or erase operation even if such operation of boot block 13 is requested in write state circuitry 20. When the write lock-out protection mechanism indicates that a program or erase operation is allowed in boot block 13, write state circuitry 20 may then access boot block 13 for the program or erase operation when requested.

The main block 12 and the parameter blocks 14 and 15 do not have the write lock-out feature of boot block 13 and are accessed for program or erase operations by write state circuitry 20 when requested. As described above, parameter blocks 14 and 15 allow a user to store frequently updated system parameters and configuration information.

Flash EPROM 10 includes a deep power down mode. When flash EPROM 10 enters into the deep power down mode, all circuits of flash EPROM 10 are powered off (except a CE2 buffer 30, which is described below) and the power consumption of flash EPROM 10 is substantially less than that of flash EPROM 10 in the standby mode. When flash EPROM 10 enters the deep power down mode from read modes memory array 11 is deselected and power supply to all circuits in flash EPROM 10 is switched off. Recovery from the deep power down mode occurs in less time than the controlling microprocessor requires to reset itself.

When flash EPROM 10 enters the deep power down mode during either the program or erase mode, flash EPROM 10 aborts the ongoing operation and the power supply is switched off. In this case, the contents of memory array 11 are no longer valid, given that the data has been corrupted by the aborted operation. In this case, the same command sequence must be repeated after normal operation is restored. As in the read mode case, all internal circuits are turned off in the deep power down mode. A recovery time is required for flash EPROM 10 to exit the deep power down mode before flash EPROM 10 is qualified for another erase or program operation.

Command state circuitry 21 is reset to the read command when flash EPROM 10 is returned to its normal operation from the deep power down mode. If the interrupted operation of flash EPROM 10 before forced into the deep power down mode is the program or erase operation, the same operation must be repeated after flash EPROM 10 exits from the deep power down mode.

Flash EPROM 10 also includes a Vcc voltage detector 32. Vcc voltage detector 32 is coupled to the Vcc power supply of flash EPROM 10. The purpose of having Vcc voltage detector 32 in flash EPROM 10 is to detect the voltage level of Vcc voltage and to terminate device operation of flash EPROM 10 when the voltage level of the Vcc voltage is not in a desired range. This helps to protect the data stored in flash EPROM 10. When Vcc voltage detector 32 detects that the voltage level of the Vcc power supply is not in the desired range, Vcc voltage detector 32 outputs a logical high LOWVCC signal on line 33. The logical high LOWVCC signal is coupled to an OR gate 31 and the signal becomes a logical high PDPWRDN signal.

The PDPWRDN signal is applied to command state circuitry 21 and write state circuitry 20. The PDPWRDN signal is the power off signal of flash EPROM 10. When the PDPWRDN signal is at the logical high level, all circuitry except CE2 buffer 30 in flash EPROM 10 is powered off by the PDPWRDN signal via command state circuitry 21 and write state circuitry 20. The PDPWRDN signal overrides any other control signal in flash EPROM 10. When the logical high PDPWRDN signal is received at write state circuitry 20 and command state circuitry 21, flash EPROM 10 is powered off regardless of its current ongoing operation.

Flash EPROM 10 includes a CE2 pin and a CE2 buffer coupled to the CE2 pin. Control signals are applied to the CE2 pin, and those control signals can cause flash EPROM 10 to enter the deep power down mode. The control signals also control the write lock-out protect mechanism in order to lock or unlock boot block 13 for program or erase operations. The control signals applied at the CE2 pin are comprised of a zero volt signal, a Vcc voltage signal, and a Vpp voltage signal. CE2 buffer receives the control signals from the CE2 pin. With respect to the control signals received, CE2 buffer 30 issues a CDCE2H control signal that controls the write lock-out protection mechanism to lock or unlock boot block 13 for the program or erase operations. CE2 buffer 30 also issues a CDCE2 control signal that makes flash EPROM 10 enter the deep power down mode.

The CDCE2 signal is applied to command state circuitry 21. In command state circuitry 21, the CDCE2 signal controls the $\overline{CE}$ and $\overline{OE}$ control functions. When the CDCE2 signal is at logical high level, the $\overline{CE}$ and $\overline{OE}$ circuits in command state circuitry 21 are enabled and may perform the chip enable and output enable function according to the control signals applied on the $\overline{CE}$ and $\overline{OE}$ pins. When the CDCE2 signal is at a logical low level, the logical low CDCE2 signal disables the $\overline{CE}$ and $\overline{OE}$ circuits so that no control function can be performed on flash EPROM 10. Flash EPROM 10 enters the deep power down mode.

The CDCE2 signal is also applied to Vcc voltage detector 32 to control the operation of Vcc voltage detector 32. When the CDCE2 signal is at the logical low level, Vcc voltage detector 32 is powered off by the logical low CDCE2 signal. When the CDCE2 signal is at the logical high voltage, Vcc voltage detector 32 operates normally and detects the voltage level of the Vcc power supply. Vcc voltage detector 32 then outputs a logical low or high LOWVCC signal to OR gate 31 according to the voltage level of the Vcc power supply.

The CDCE2 signal is also applied to OR gate 31 via an inverter 45. The other input of OR gate 31 is the LOWVCC signal. OR gate 31 outputs the power off PDPWRDN signal. When the CDCE2 signal is at the logical low level, OR gate 31 outputs a logical high PDPWRDN signal regardless of the LOWVCC signal. The logical high PDPWRDN signal then is applied to command state circuitry 21 and write state circuitry 20 to switch off the power supply of all circuitry in flash EPROM 10 (except CE2 buffer 30). Flash EPROM 10 then enters the deep power down mode. When the CDCE2 signal is at the logical high level, the logical level of the PDPWRDN signal depends on the logical level of the LOWVCC signal. If the LOWVCC signal is at the logical high level which means that the voltage level of the Vcc power supply is not in the desired range, OR gate 31 also outputs a logical high PDPWRDN signal to switch off the power supply to all circuitry in flash EPROM 10.

The CDCE2H signal from CE2 buffer 30 is applied to write state circuitry 20. The CDCE2H signal is the control signal that controls the write lock-out protection mechanism to lock or unlock boot block 13 for the program or erase operations. When the CDCE2H signal is at logical high level, the write lock-out protection mechanism unlocks boot block 13 and allows write state circuitry 20 to program or erase boot block 13. When the CDCE2H signal is at logical low level, a program or erase operation to boot block 13 is prohibited by the write lock-out protection mechanism. When a boot block erase or a boot block program request is received at write state circuitry 20, write state circuitry 20 first checks whether the write lock-out protection mechanism is locked by checking whether the CDCE2H signal is at the logical high level. If the CDCE2H signal is at the logical high level, it means that the write lock-out protection mechanism is released and a program or erase operation with respect to boot block 13 is allowed. Write state circuitry 20 then controls the program or erase with respect to boot block 13. If the CDCE2H signal is at is logical low level, it indicates that the write lockout protection mechanism is locked and the program or erase operation in boot block 13 is prohibited by the write lockout mechanism. Write state circuitry 20 cannot access boot block 13 for the program or erase operation even if write state circuitry 20 receives the boot block program and/or erase request.

When the CE2 pin is applied with the Vcc voltage, CE2 buffer outputs the logical high CDCE2 signal on line 34. The logical high CDCE2 signal is then applied to command state circuitry 21. Flash EPROM 10 is in its normal operation and is controlled by the control signals other than the CE2 control signal. The $\overline{WE}$ signal controls the write to command state circuitry 21. The $\overline{OE}$ signal controls the output of flash EPROM 10 and the chip enable $\overline{CE}$ signal controls the device selection of flash EPROM 10.

Vcc voltage detector 31 is powered on by the logical high CDCE2 signal. Vcc voltage detector 31 then detects whether the Vcc voltage is at the desired range of voltage levels and outputs a logical low or high LOWVCC signal to OR gate 31. OR gate 31 is only controlled by the LOWVCC signal to output the logical high power off PDPWRDN signal. When Vcc voltage detector 31 detects that the voltage level of the Vcc power supply is not in the desired range. OR gate 31 outputs the logical high power off PDPWRDN signal.

CE2 buffer 30 also outputs the logical low CDCE2H signal to write state circuitry 20 via line 35. The logical low CDCE2H signal locks the write state circuitry 20 via line 35. The logical low CDCE2H signal locks the write lock-out protection mechanism for boot block 13.

Write state circuitry 20 is thereby prevented from accessing boot block 13 for any program or erase operation.

When the CE2 pin is applied with the Vpp voltage, the CDCE2 signal is maintained at the logical high level. In this case, command state circuitry 21 and Vcc voltage detector 32 remain enabled by the logical high CDCE2 signal, and OR gate 31 is controlled by the LOWVCC signal. Command state circuitry 21 is controlled by the $\overline{CE}$, $\overline{OE}$ and $\overline{WE}$ signals.

The CDCE2H signal, however, is raised to logical high level when the Vpp voltage is applied to the CE2 pin. When the CDCE2H signal is at the logical high level, the logical high CDCE2H signal unlocks the write lockout protection mechanism for boot block 13. Program or erase operations with respect to boot block are therefore allowed. The write lock-out protection mechanism remains unlocked as long as the Vpp voltage remains on the CE2 pin.

When the CE2 pin is applied with the zero volt signal, both the CDCE2 signal and the CDCE2H signal are at the logical low level. Logical low CDCE2 signal disables command state circuitry 21 from acting upon the $\overline{CE}$, $\overline{OE}$, and $\overline{WE}$ control signals. Vcc voltage detector 32 is also powered off by the logical low CDCE2 signal. The power off PDPWRDN signal is set at the logical high level by the logical low CDCE2 signal. The logical high PDPWRDN signal is then applied to command state circuitry 21 and write state circuitry 20 to switch off the power supply of all circuitry in flash EPROM 10 (except CE2 buffer 30). Flash EPROM 10 therefore enters into the deep power down mode.

When the zero volt signal on the CE2 pin is replaced by the Vcc voltage, the CDCE2 signal becomes logical high and flash EPROM 10 exits from the deep power down mode and returns to its normal operation. The CDCE2H signal remains inactive low.

As described above, when the voltage level of the input signal on the CE2 pin changes from the zero volts to the Vcc voltage, flash EPROM 10 exits from the deep power down mode. A transitional time period in which flash EPROM 10 is fully recovered to its normal operational mode from the deep power down mode is needed. The recovery time is faster than or at least equal to the reset time of the external microprocessor that controls the operation of flash EPROM 10. This means that if flash EPROM 10 is brought back to the normal power on state from the deep power down mode at the same time when the external microprocessor is resetting, the data stored in memory array 11 of flash EPROM 10 will be ready for the external microprocessor to access when the external microprocessor sends its read command to flash EPROM 10.

In one embodiment, the recovery time of flash EPROM 10 is 600 nanoseconds. In alternative embodiments, the recovery time of flash EPROM 10 can be faster or slower than 600 nanoseconds, depending upon the reset time of its external controlling microprocessor.

FIG. 2 is a more detailed block diagram of CE2 buffer 30 of FIG. 1. In FIG. 2, CE2 buffer 30 includes a buffering circuit 100 and a high voltage detector 101 coupled to buffering circuit 100. Buffering circuit 100 is connected to the CE2 pin via line 103. Buffering circuit 100 receives a CE2PAD signal from the CE2 pin via line 103. Buffering circuit 100 is connected to high voltage detector 101 via line 105. Buffering circuit 100 applies a CHTTLIN signal to high voltage detector 101 via line 105. Buffering circuit 100 outputs the CDCE2 signal via line 34 to inverter 45 and command state circuitry 21 (both shown in FIG. 1). High voltage detector 101 outputs the CDCE2H signal to write state circuitry 20 via line 35.

The CE2PAD signal applied at CE2 pin is received by buffering circuit 100 via line 103. The CE2PAD signal may be zero volts, Vcc voltage, or Vpp voltage. The Vcc voltage is approximately 5 volts and the Vpp voltage is approximately 12 volts.

Buffering circuit 100 is designated to output a logical low CDCE2 signal when the CE2PAD signal is at the zero volt level. As described above, flash EPROM 10 in this case is required to enter into the deep power down mode. The logical low CDCE2 signal is then applied to OR gate 31 via inverter 45 (both shown in FIG. 1) to produce the logical high power down PDPWRDN signal. The logical high PDPWRDN signal then puts flash EPROM 10 into the deep power down mode that turns off the power supply to all circuits of flash EPROM 10, except CE2 buffer 30. When the CE2PAD signal is at the Vcc voltage that means flash EPROM 10 shall be brought back to normally powered state from the deep power down mode, buffering circuit 100 outputs a logical high CDCE2 signal. In this case, the PDPWRDN signal becomes logical low that causes flash EPROM 10 to exit from the deep power down mode. Buffering circuit 100 maintains its output CDCE2 signal at the logical high level when the input CE2PAD signal is raised to the Vpp voltage.

Buffering circuit 100 passes the CE2PAD signal to high voltage detector 101. Buffering circuit 100 lowers the voltage level of the CE2PAD signal before passes it to become the CHTTLIN signal for high voltage detector 101. High voltage detector 101 detects the Vpp voltage in the CE2PAD signal. When the high Vpp voltage is applied as the CE2PAD signal to the CE2 pin, high voltage detector 101 detects the high voltage and produces a logical high CDCE2H signal at its output. The logical high CDCE2H signal is then applied to write state circuitry 20 via line 35 to inform that programming or erasure to boot block 13 is permitted. When the zero volts or the Vcc voltage are applied as the CE2PAD signal to the CE2 pin, high voltage detector 101 outputs a logical low CDCE2H signal to write state circuitry 20. In this case, the programming or erasure of boot block 13 by write state circuitry 20 is not permitted.

FIG. 3 illustrates the circuit diagram of buffering circuit 100 of FIG. 2. In FIG. 3, buffering circuit 100 includes an electro-static discharge protection circuit 312. Circuit 312 includes resistor 300 and transistor 308 and 309. When the voltage from the CE2 PIN is abnormally high due to electrostatic discharge circuit 312 lowers the voltage level that reaches node 310. During normal operation circuit 312 has no effect upon buffer circuit 100 so that the voltage at node 310 is the same as the voltage on the CE2 PIN. Thus, it will be understood that the input to high voltage detector 101, CHTTLIN, is substantially the same as the voltage at the CE2 pin.

Transistors 301, 302, 303 and 304 of buffering circuit 100 are connected in series. Transistors 301 and 302 are P channel transistors and transistors 303 and 304 are N channel transistors. Transistors 302 and 303 form the inverter having input node 310 and output node 311 and transistors 301 and 304 are always on. Node 311 is connected to the output CDCE2 of buffering circuit 100 via inverters 305, 306 and 307.

As described above, the CE2PAD signal includes a zero volt signal, a Vcc voltage signal, and a Vpp high voltage signal. Therefore, the input node 310 of the inverter formed by transistors 302 and 303 is subjected to these three voltage levels. However, the inverter of transistors 302 and 303 only responds to the zero volt signal and the Vcc voltage signal. The inverter recognizes the Vpp high voltage signal as the Vcc voltage signal and responds accordingly.

During operation, when the CE2 pin of buffering circuit 100 is applied with the zero volt signal, node 310 is at zero volts and node 311 is at the Vcc voltage. The Vcc voltage at node 311 is then coupled via inverters 305, 306 and 307 to become a logical low CDCE2 signal at the output of buffering circuit 100. When the CE2 pin of buffering circuit 100 is applied with the Vcc voltage signal or the Vpp high voltage signal, node 310 is at the Vcc level or Vpp voltage level. Node 311 is therefore coupling a zero volt signal to inverter 305. In this case, the output signal CDCE2 of buffering circuit 100 becomes logical high.

Buffering circuit 100 also applies the incoming CE2-PAD signal to high voltage detector 101 via circuit 312 for detecting the 12 volt high voltage signal in the CE2-PAD signal. The CE2PAD signal then becomes the CHTTLIN signal of which the voltage level is lower than that of the CE2PAD signal.

FIG. 4 shows the circuit diagram of high voltage detector 101 of FIG. 2. High voltage detector 301 in FIG. 4 is designed to output a logical high CDCE2H signal to write state circuitry 20 via line 35 when its CHTTLIN input signal is at the high voltage Vpp. Transistors 401, 402, 403 and 404 of high voltage detector 101 are connected in series, with the drain drain of transistor 401 connected to the CHTTLIN input of high voltage detector 101.

At node 410, the drain of transistor 403 is connected by inverters 405 and 406 to the output CDCE2H of high voltage detector 101. Transistor 401 serves as a load transistor in the branch formed by transistors 401, 402, 403 and 404. The gates of transistors 402, 403, and 404 are all connected to the power supply Vcc. Transistor 402 is a P channel transistor and transistors 403 and 404 are N channel transistors. The function of transistor 404 is to make sure the output CDCE2H of high voltage detector 101 has zero volt output when outputting a logical low signal. N channel transistors 407, 408, and 409 are connected in parallel, with their gates coupled to the power supply Vcc and drains and sources coupled to ground. One, two or all three transistors 407, 408 and 409 may be coupled to node 411 during manufacture to alter the trip point of circuit 101. The input CHTTLIN signals comprise the voltage levels of zero volts, Vcc voltage, and Vpp voltage. In this case, the Vcc voltage is lower than 5 volts and the Vpp voltage is lower than 12 volts.

When the CHTTLIN input signal is at the high voltage Vpp, transistors 402 and 403 are on ON condition. At this point, transistor 404 is weak conducting, which pulls up the drain output of transistor 404 to Vcc minus Vt voltage. Vt is the threshold voltage of transistor 404. Through inverters 405 and 406, a logical high voltage output is acquired at the output CDCE2H of high voltage detector 101. When the input CHTTLIN of high voltage detector 101 is at either zero or Vcc voltage, P channel transistor 402 is set at OFF condition by these voltages. Therefore, the output CDCE2H of high voltage detector 101 outputs a logical low voltage signal. The ON condition of transistor 404 at this time also makes sure that the output CDCE2H is at zero voltage.

As described above, the output signal CDCE2H is applied to write state circuitry 20 of FIG. 1 via line 35 to control the access to the boot block 13 for a program or erase operation. When the CDCE2H signal is at logical high voltage, the write state circuitry 20 is allowed to access boot block 13 for a program or erase operation.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A non-volatile memory, comprising:
   (a) a memory array that includes
       (1) a main block; and
       (2) a boot block;
   (b) a control input for receiving a control signal, wherein the control signal can be in a first voltage state, a second voltage state, and a third voltage state; and
   (c) circuitry means coupled to receive the control signal at the control input for (1) allowing the boot block to be updated when the control signal is in the first state and
       (2) for generating a power off signal to switch the memory into a substantially powered off state when the control signal is in the third voltage state.

2. The memory of claim 1, wherein the circuitry means is transparent to the memory when the control signal applied to the control input is in the second voltage state.

3. The memory of claim 1, wherein the first voltage state is approximately 12 volts, the second voltage state is approximately 5 volts, and the third voltage state is ground.

4. The memory of claim 1, wherein the memory cell of the boot block is electrically erasable and electrically programmable.

5. The memory of claim 1, wherein the circuitry means further includes:
   (a) a buffering circuit coupled to the control input for buffering the second state and the third state of the control signal; and
   (b) a high voltage detector coupled to the buffering circuit for detecting the first voltage state of the control signal.

6. A method of controlling a non-volatile memory having a main block and a boot block, comprising the steps of:
   (A) applying a control signal to the memory, wherein the control signal can be in a first voltage state, a second voltage state, and a third voltage state;
   (B) determining the voltage state of the control signal applied to the memory by a buffering means;
   (C) allowing the boot block to be updated when said control signal is determined to be in the first state; and
   (C) generating a power off signal to switch the memory into a substantially powered off state when the control signal is determined to be in the third voltage state.

7. The method of claim 6, wherein the memory is electrically erasable and electrically programmable.

8. The method of claim 6, wherein the first voltage state is approximately 12 volts, the second voltage state is approximately 5 volts, and the third voltage state is ground.

9. The method of claim 6, further comprising the step of allowing the control signal transparent to the memory when the control signal is determined to be in the second voltage state.

* * * * *

UNITED STATES PATENT AND TRADEMARK OFFICE
CERTIFICATE OF CORRECTION

PATENT NO. : 5,197,034
DATED : March 23, 1993
INVENTOR(S) : Mickey L. Fandrich

It is certified that error appears in the above-indentified patent and that said Letters Patent is hereby corrected as shown below:

| | | |
|---|---|---|
| Col. 6, Line 40 | After "read modes" | Insert --,-- |
| Col. 8, Line 65 - 67 | Delete "The logical low CDCE2H signal locks the write state circuitry 200." | |
| Col. 12, Line 65 | Delete "(C)" | Insert --(D)-- |

Signed and Sealed this

Twenty-third Day of August, 1994

Attest:

BRUCE LEHMAN

Attesting Officer

Commissioner of Patents and Trademarks